United States Patent
Lee et al.

(10) Patent No.: US 11,300,720 B2
(45) Date of Patent: Apr. 12, 2022

(54) OPTICAL FILM AND DISPLAY DEVICE HAVING THE SAME

(71) Applicant: Samsung Display Co., Ltd., Yongin-si (KR)

(72) Inventors: Hee Young Lee, Yongin-si (KR); Eun Mi Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 419 days.

(21) Appl. No.: 15/842,791

(22) Filed: Dec. 14, 2017

(65) Prior Publication Data

US 2018/0299603 A1  Oct. 18, 2018

(30) Foreign Application Priority Data

Apr. 17, 2017  (KR) .......................... 10-2017-0049329

(51) Int. Cl.
*G02B 5/30* (2006.01)
*G02B 1/08* (2006.01)
(Continued)

(52) U.S. Cl.
CPC ............. *G02B 5/3083* (2013.01); *G02B 1/08* (2013.01); *G02B 1/11* (2013.01); *G02B 5/3016* (2013.01); *G02F 1/133528* (2013.01); *H01L 27/3246* (2013.01); *H01L 51/0097* (2013.01); *H01L 51/5064* (2013.01)

(58) Field of Classification Search
CPC ............ G02F 1/133528; G02B 5/3016; G02B 5/3083; G02B 27/28; G02B 5/3041; G02B 5/3025; G02B 5/30
See application file for complete search history.

(56) References Cited

U.S. PATENT DOCUMENTS 6,512,557 B1 *  1/2003  Miwa ................... G02B 6/0088
                                                  349/58
9,894,781 B2 *  2/2018  Franklin .............. H05K 5/0017
(Continued)

FOREIGN PATENT DOCUMENTS

CN        102053421        5/2011
CN        104700771        6/2015
(Continued)

OTHER PUBLICATIONS

Office Action dated May 8, 2021 from the China National Intellectual Property Administration for Chinese Patent Application No. 201810341030.7 with English statement of relevance.

*Primary Examiner* — Christopher Stanford
(74) *Attorney, Agent, or Firm* — H.C. Park & Associates, PLC

(57) ABSTRACT

An optical film may include: a phase retardation layer; a polarizer disposed on the phase retardation layer and including a first part defined by a pair of sides extending in a first direction and a pair of sides extending in a second direction and a second part protruding from the first part; and a protective film protecting the polarizer. Here, one short side of the second part of the polarizer adjacent the first part may include a curved part. The polarizer may include an absorption axis in a direction parallel to a tangent line of a part having the most curvature at the curved part.

5 Claims, 10 Drawing Sheets

(51) Int. Cl.
*H01L 27/32* (2006.01)
*G02B 1/11* (2015.01)
*G02F 1/1335* (2006.01)
*H01L 51/00* (2006.01)
*H01L 51/50* (2006.01)

(56) References Cited

U.S. PATENT DOCUMENTS

| | | | |
|---|---|---|---|
| 10,171,636 B2* | 1/2019 | Yeo | G03B 29/00 |
| 10,202,298 B2 | 2/2019 | Yabuuchi et al. | |
| 10,403,857 B2* | 9/2019 | Maruyama | G02B 5/3016 |
| 10,650,717 B2 | 5/2020 | Jung | |
| 10,820,422 B2* | 10/2020 | Jang | H05K 1/147 |
| 10,908,340 B2 | 2/2021 | Namkung et al. | |
| 2008/0117367 A1* | 5/2008 | Abe | H05K 3/361 349/106 |
| 2008/0252847 A1* | 10/2008 | Nesty | G02C 7/10 351/159.64 |
| 2009/0303413 A1* | 12/2009 | Ohta | G02B 5/045 349/62 |
| 2010/0033443 A1 | 2/2010 | Hashimoto | |
| 2011/0273643 A1* | 11/2011 | Arai | G02F 1/133528 349/64 |
| 2012/0069241 A1* | 3/2012 | Shiau | G06F 1/1605 348/373 |
| 2012/0327413 A1* | 12/2012 | Borwick | G02B 5/3025 356/364 |
| 2013/0002133 A1 | 1/2013 | Jin et al. | |
| 2013/0002993 A1* | 1/2013 | Oh | G02F 1/133528 349/96 |
| 2013/0300717 A1* | 11/2013 | Yang | G06F 3/041 345/176 |
| 2013/0300974 A1 | 11/2013 | Yoshimoto | |
| 2014/0101560 A1 | 4/2014 | Kwak et al. | |
| 2014/0160694 A1* | 6/2014 | Yoon | G02F 1/1303 361/749 |
| 2015/0369981 A1* | 12/2015 | Takeda | G02B 5/305 359/488.01 |
| 2016/0195763 A1* | 7/2016 | Matsueda | G02F 1/133528 349/58 |
| 2016/0260406 A1* | 9/2016 | Seen | G02F 1/1368 |
| 2017/0174547 A1* | 6/2017 | Yabuuchi | C03C 14/00 |
| 2017/0278902 A1 | 9/2017 | Choi et al. | |
| 2017/0352311 A1* | 12/2017 | Lee | G09G 3/3648 |
| 2018/0090061 A1* | 3/2018 | Kim | G09G 3/3208 |
| 2018/0102509 A1* | 4/2018 | Kim | H01L 51/56 |
| 2018/0151539 A1* | 5/2018 | Nakamura | H01L 27/3211 |
| 2019/0267434 A1* | 8/2019 | Liu | G06F 1/1637 |

FOREIGN PATENT DOCUMENTS

| | | |
|---|---|---|
| CN | 105390068 | 3/2016 |
| CN | 106461849 | 2/2017 |
| JP | 2013235146 | 11/2013 |
| KR | 10-2014-0044228 | 4/2014 |
| KR | 10-2017-0113762 | 10/2017 |
| KR | 10-2018-0061485 | 6/2018 |
| WO | 2015198934 | 12/2015 |
| WO | 2016158300 | 10/2016 |

* cited by examiner

OPTICAL FILM AND DISPLAY DEVICE HAVING THE SAME

CROSS-REFERENCE TO RELATED APPLICATION

This application claims priority from and the benefit of Korean Patent Application No. 10-2017-0049329, filed on Apr. 17, 2017, which is hereby incorporated by reference for all purposes as if fully set forth herein.

BACKGROUND

Field

Exemplary embodiments relate to an optical film and a display device having the same.

Discussion of the Background

A display device may polarize the light that comes out from the light source using a polarizing film to enhance efficiency of the light, thereby displaying images with improved reliability.

Particularly, in order to apply the polarizing film to the display device, it would be necessary to cut the polarizing film into consistent pieces by performing a cutting processing using laser and so forth.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide an optical film and a display device having the same.

Exemplary embodiments provide an optical film with improved reliability and a display device having the same.

Additional aspects will be set forth in the detailed description which follows, and, in part, will be apparent from the disclosure, or may be learned by practice of the inventive concepts.

In an exemplary embodiment, an optical film may include a phase retardation layer, a polarizer disposed on the phase retardation layer and including a first part surrounded by a pair of sides extending in a first direction and a pair of sides extending in a second direction and a second part protruding from the first part and a protective film protecting the polarizer. Here, one short side of the second part of the polarizer adjacent the first part may include a curved part. The polarizer may include an absorption axis in a direction parallel to a tangent line of a part having the most curvature at the curved part.

In an exemplary embodiment, the absorption axis of the polarizer may be ±30° from the tangent line.

In an exemplary embodiment, the polarizer may include a polyvinyl alcohol based resin.

In an exemplary embodiment, the phase retardation layer may include any one of $\lambda/4$ retardation film, $\lambda/2$ retardation film and a liquid crystal coating film.

In an exemplary embodiment, a display device may include a display panel having a display area for displaying images on a front surface and a non-display area disposed on at least one side of the display area, a polarizing film disposed on the display panel and a window covering the polarizing film. Here, the polarizing film may include a first part corresponding to the display area and a second area corresponding partly to the non-display area and protruding from the first part. One short side of the second part adjacent the first part may include a curved part. The polarizing film may include an absorption axis in a direction parallel to the tangent line having the most curvature at the curved part.

In an exemplary embodiment, the absorption axis of the polarizing film may be ±30° from the tangent line.

In an exemplary embodiment, the polarizing film may include a phase retardation layer and a linear polarizer disposed on the phase retardation layer.

In an exemplary embodiment, the linear polarizer may include a polyvinyl alcohol based resin.

In an exemplary embodiment, the display device may further include a chip on film overlapping a portion of the display panel and having a plurality of wires and a flexible printed circuit board connected to one side of the chip on film.

In an exemplary embodiment, the polarizing film may further include an opening exposing the chip on film by corresponding to an area where the chip on film overlaps the display panel.

In an exemplary embodiment, the opening may have a chamfering shape.

In an exemplary embodiment, the display panel may include at least one thin film transistor disposed on the display area and a display element connected to the thin film transistor.

In an exemplary embodiment, the display element may include a first electrode connected to the thin film transistor, a light emitting layer disposed on the first electrode and irradiating light and a second electrode disposed on the light emitting layer.

In an exemplary embodiment, the polarizing film may have flexibility.

In an exemplary embodiment, the display device may further include a touch sensing part disposed on the display panel and detecting touch.

In an exemplary embodiment, the touch sensing part may include any one of a self capacitive touch sensor and a mutual capacitive touch sensor.

In an exemplary embodiment, the display device may further include a barrier layer disposed on a lower part of the display panel and supporting and protecting the display panel. Here, the barrier layer may include a cushion layer.

In an exemplary embodiment, since the polarizing film has an absorption axis corresponding to a shape of an opening, crack may be minimized and an optical film with improved reliability may be provided.

In an exemplary embodiment, a display device including the optical film may be provided.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Figure 1:
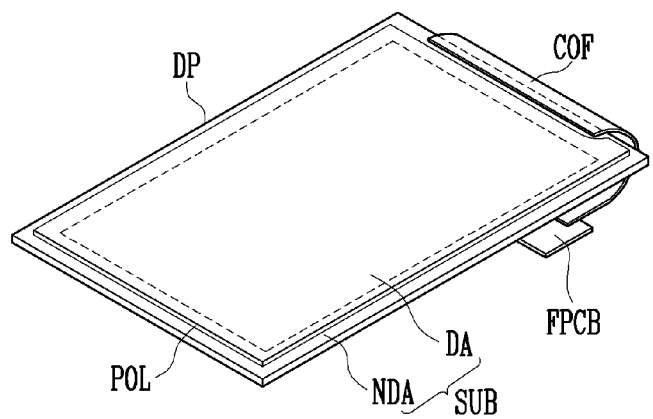

The above and other features and advantages of the present invention will become more apparent to those of ordinary skill in the art by describing in detail exemplary embodiments with reference to the attached drawings in which:

FIG. 1 is a perspective view of a display device according to an exemplary embodiment.

Figure 2:
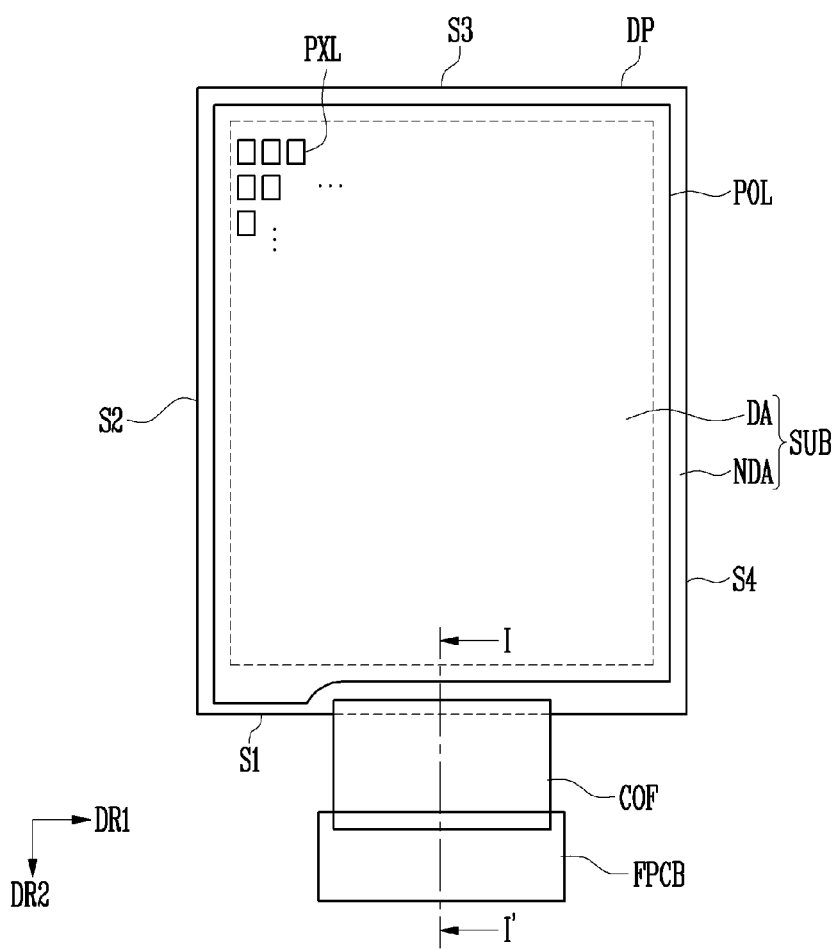

FIG. 2 is a plan view of a display device shown in FIG. 1.

Figure 3:
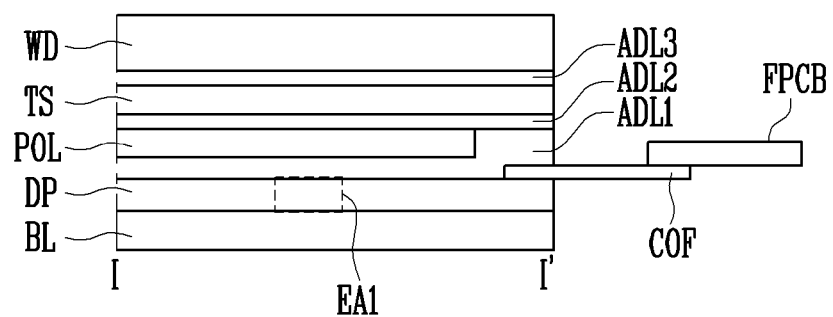

FIG. 3 is a cross-sectional view along line I~I' in FIG. 2.

Figure 4:
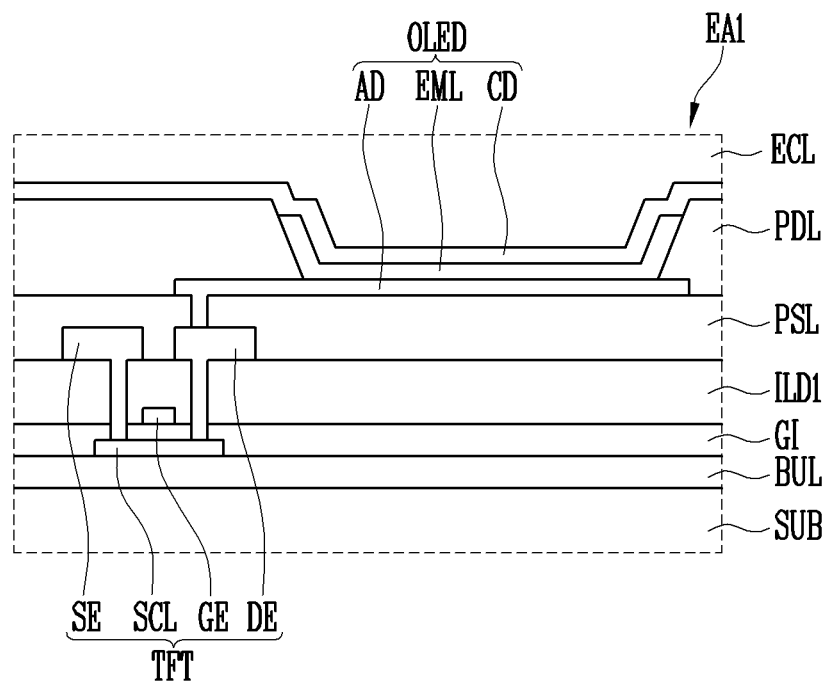

FIG. 4 is a cross-sectional view with an enlarged view of EA1 in FIG. 3.

Figure 5:
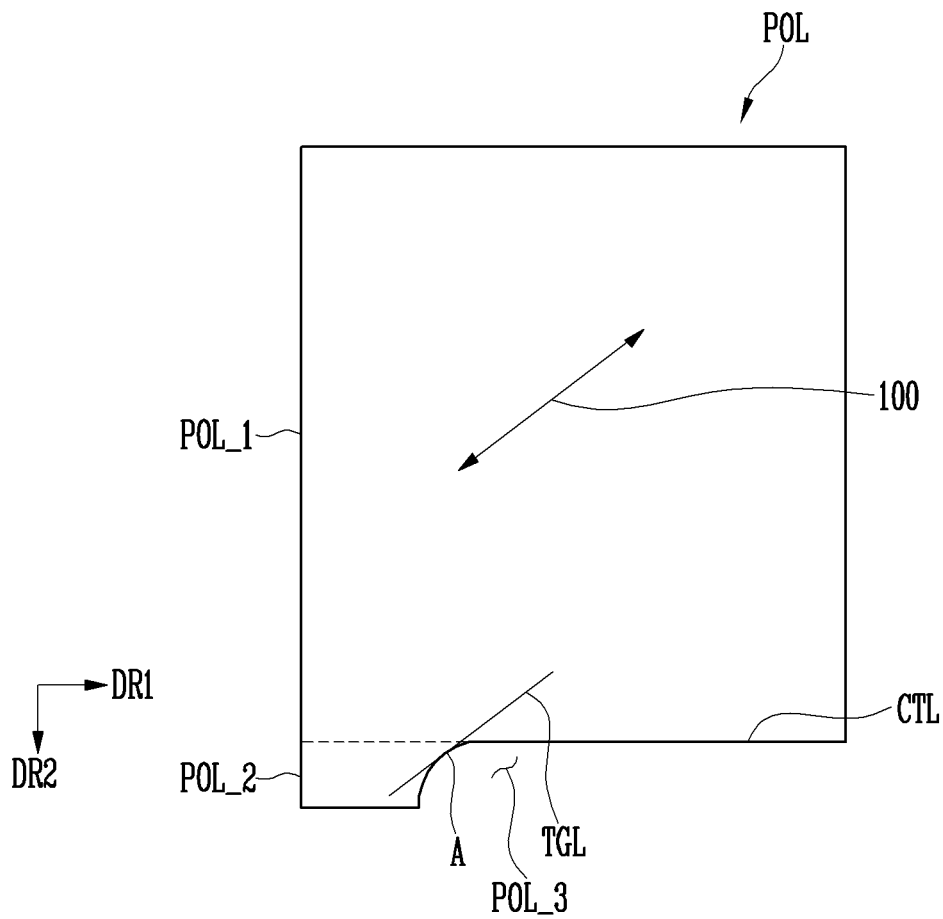

FIG. 5 is a planar view of a polarizing film according to an exemplary embodiment.

Figure 6:
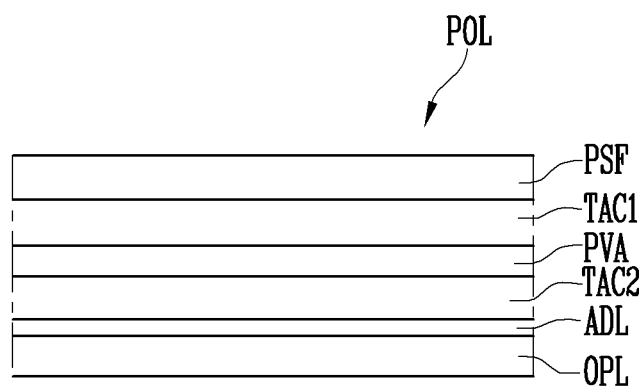

FIG. 6 is a cross-sectional view of a polarizing film in FIG. 5.

Figure 7:
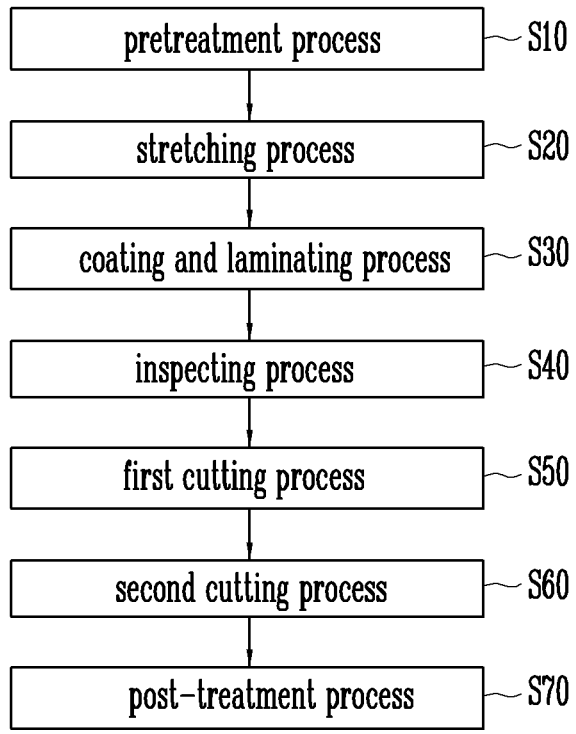

FIG. 7 is a block diagram of an exemplary process of manufacturing a polarizing film in FIGS. 5 and 6.

Figure 8:
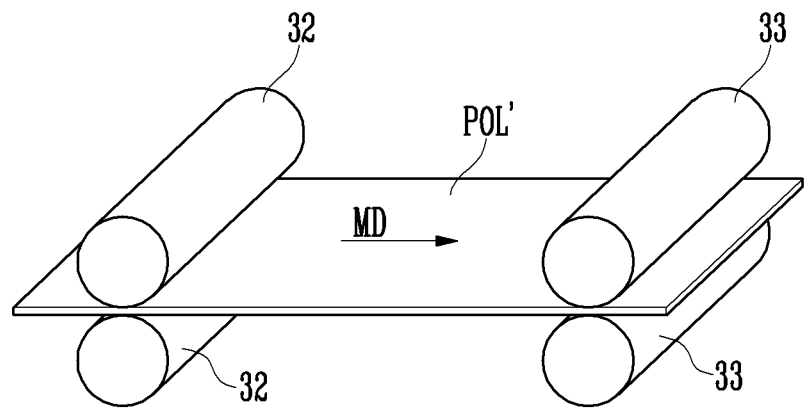

FIG. 8 is a perspective view for schematically illustrating a stretching process from an exemplary manufacturing process of a polarizing film in FIG. 7.

Figure 9:
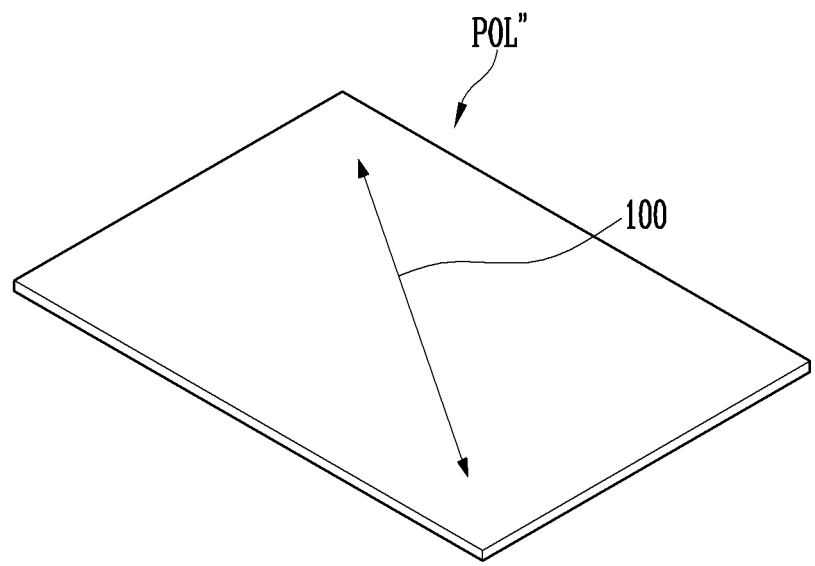

FIG. 9 is a perspective view of a polarizing film with respect to which a first cutting process has been performed from the exemplary manufacturing process of the polarizing film in FIG. 7.

Figure 10:
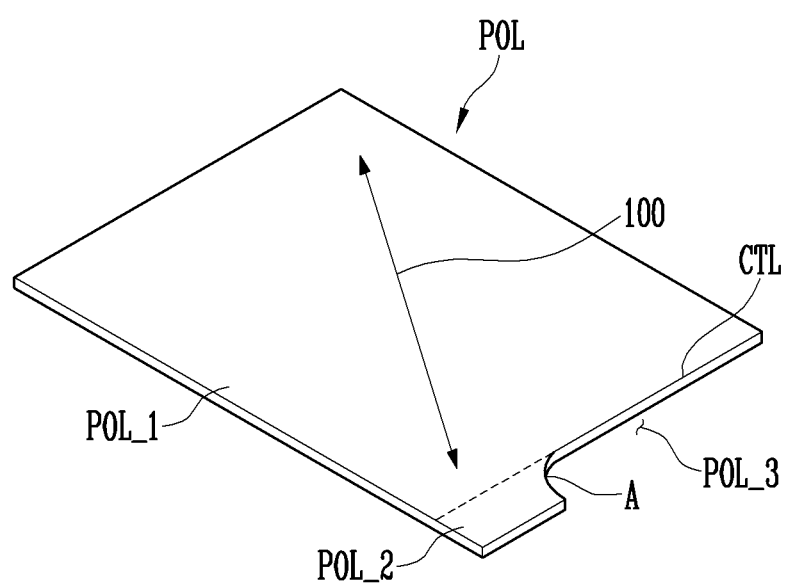

FIG. 10 is a perspective view of a polarizing film with respect to which a second cutting process has been performed from the exemplary manufacturing process of the polarizing film in FIG. 7.

Figure 11A:
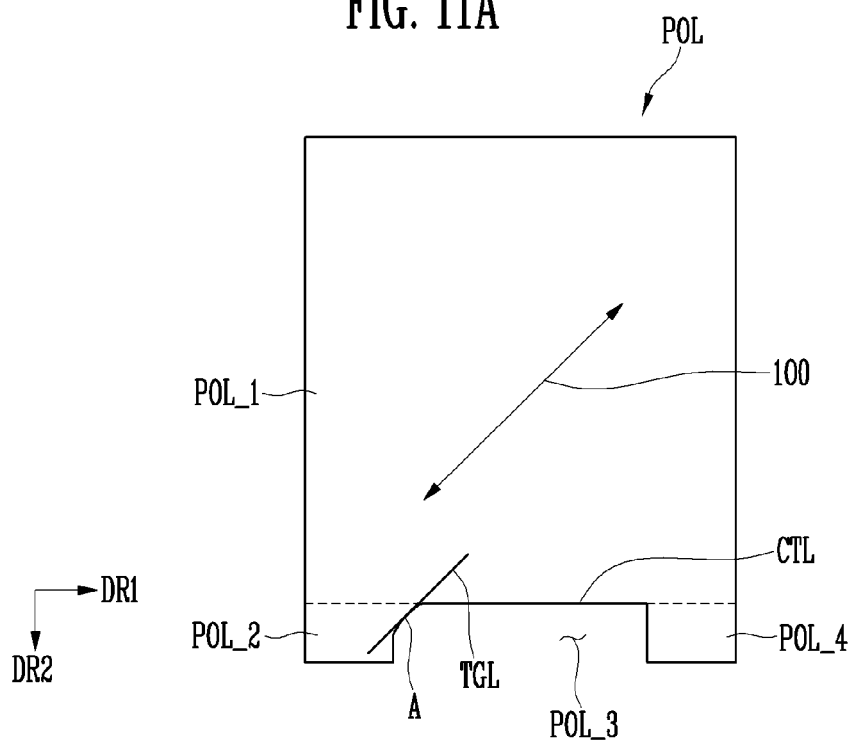
Figure 11B:
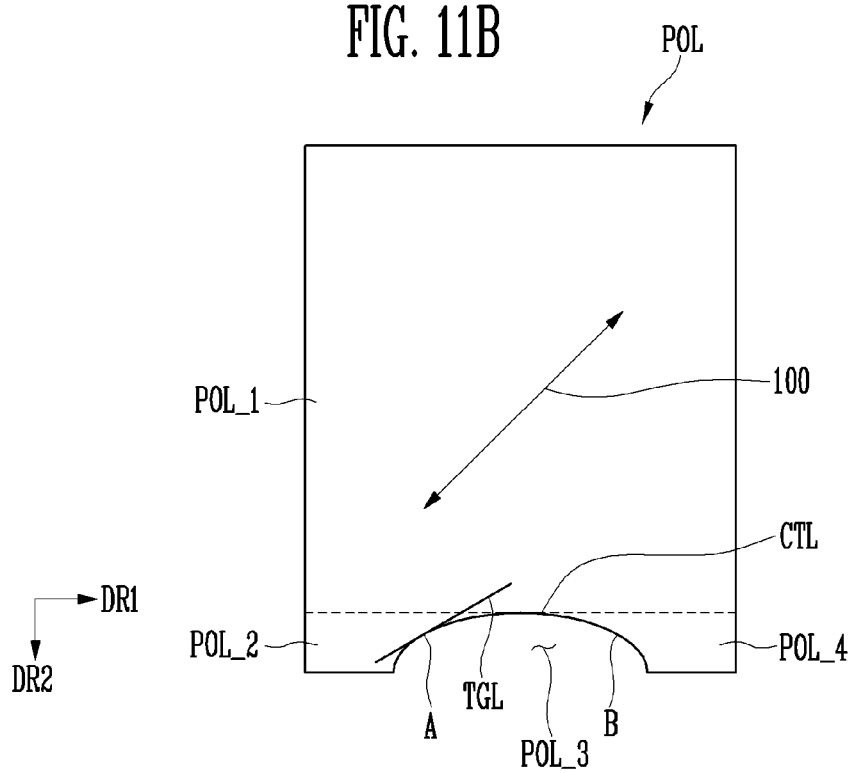

FIGS. 11A and 11B are plan views of a polarizing film according to another exemplary embodiment.

Figure 12:
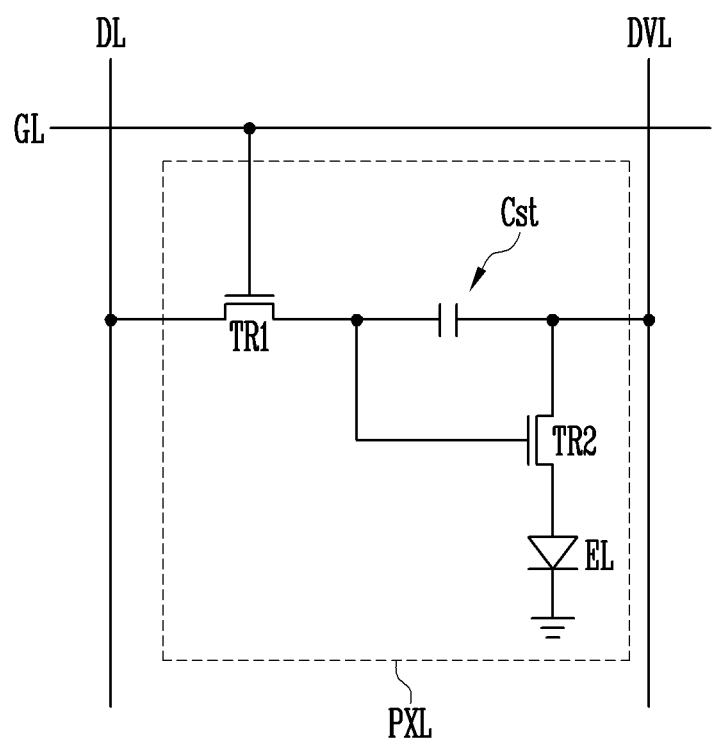

FIG. 12 is an equivalent circuit diagram illustrating one pixel out of the pixels shown in FIG. 2.

Figure 13:
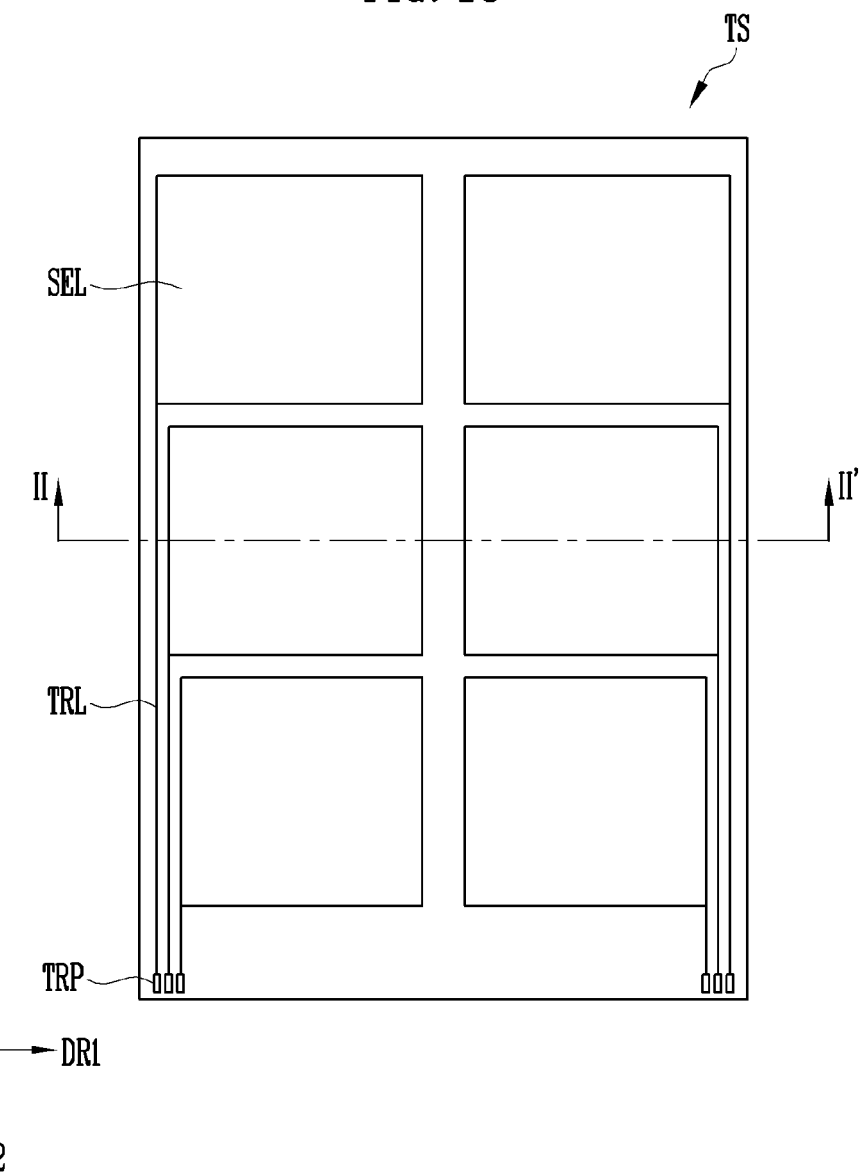

FIG. 13 is a plan view of a touch sensing part in FIG. 3 where the touching sensing part is self capacitive.

Figure 14:
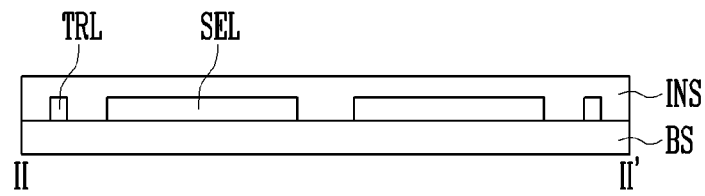

FIG. 14 is a cross-sectional view along the line II~II' in FIG. 13.

Figure 15:
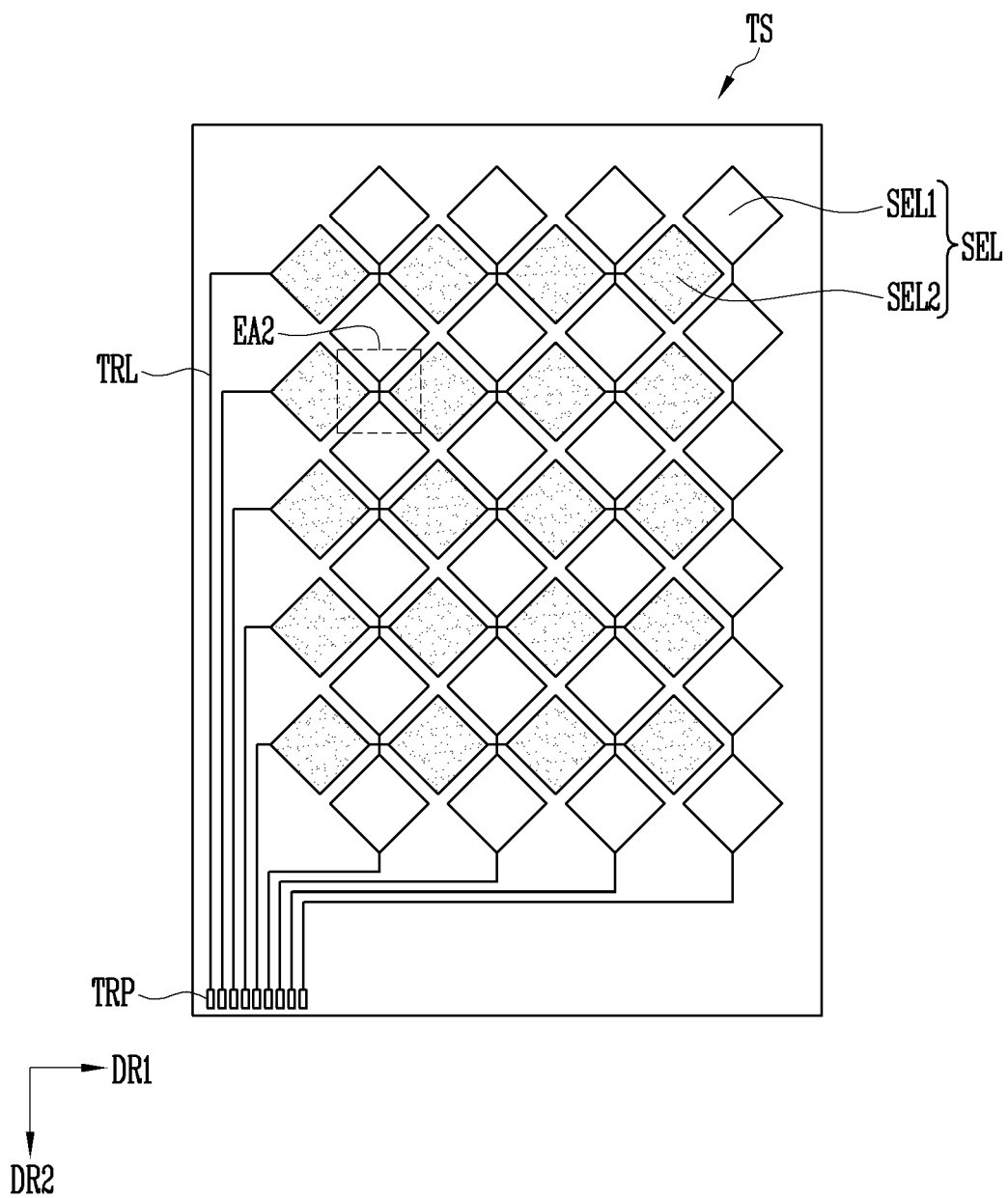

FIG. 15 is a plan view of a touching sensing part in FIG. 3 where the touching sensing part is mutual capacitive.

Figure 16:
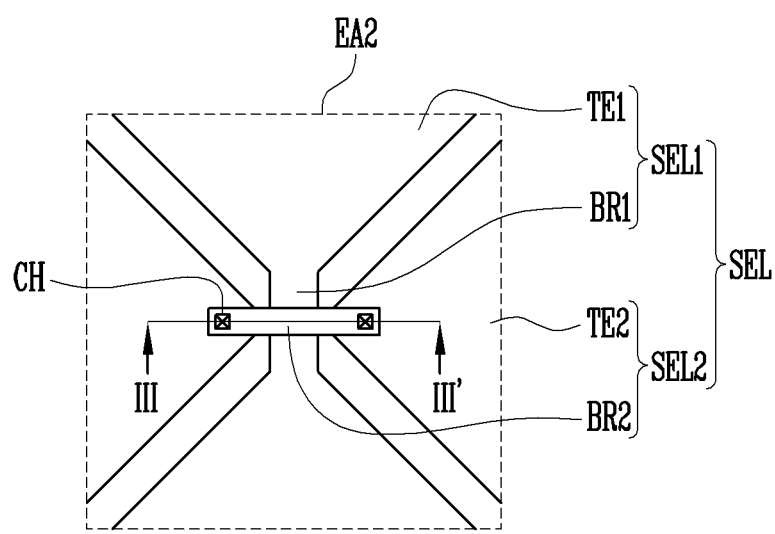

FIG. 16 is a plan view with an enlarged view of EA2 in FIG. 15.

Figure 17:
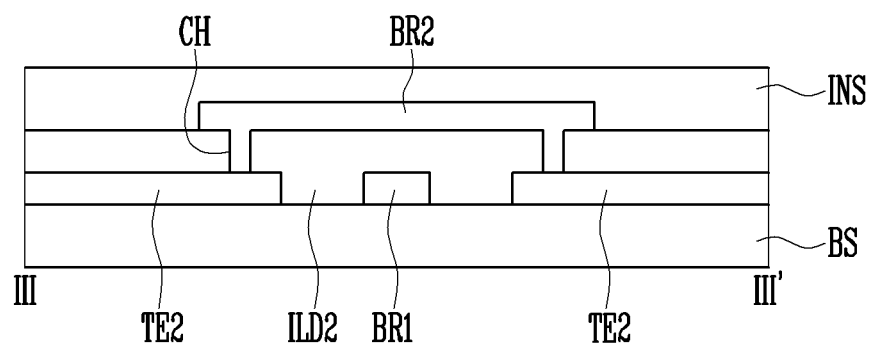

FIG. 17 is a cross-sectional view along the line III~III' in FIG. 16.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view of a display device according to an exemplary embodiment. FIG. 2 is a plan view of a display device shown in FIG. 1.

Referring to FIGS. 1 and 2, the display device according to an exemplary embodiment may include a display panel DP, a driving circuit board and a polarizing film POL.

In an exemplary embodiment, the display panel DP may include a substrate SUB, pixels PXL disposed on the substrate SUB and a wiring part connected to the pixels PXL.

The substrate SUB may include a display area DA and a non-display area NDA disposed on at least one side of the display area DA.

The substrate SUB may generally be quadrilateral, rectangular in particular, in shape. In an exemplary embodiment, the substrate SUB may include a pair of short sides 51 and S3 parallel to each other in a first direction DR1 and a pair of long sides S2 and S4 parallel to each other in a second direction that crosses the first direction DR1.

However, the shape of the substrate SUB is not limited thereto, and the substrate SUB may have various shapes. For example, but without limitation thereto, the substrate SUB may be a polygon having straight sides and a closed shape, a circle that has a curved side, an oval, etc. The substrate SUB may be a semicircle, a half ellipse, etc. which has sides that are straight and curved. In an embodiment, if the substrate SUB has a straight side, a portion of a corner of each shape may be a curve. For example, but without limitation thereto, if the substrate SUB has a rectangular shape, a section where adjacent straight sides meet may be replaced by a curved side having a predetermined curvature. That is, a vertex part having a rectangular shape may be formed of a curved side where two adjacent ends are connected to two adjacent straight sides and having a predetermined curvature. The curvature may be variably set. For example, but without limitation thereto, the curvature may vary depending on a location where the curve starts, a length of the curve, etc.

The display area DA may be an area where images are displayed by providing a plurality of pixels PXL.

The display area DA may have a shape corresponding to the shape of the substrate SUB. For example, but without limitation thereto, the display area DA may, like the substrate SUB, be a polygon having straight sides and a closed shape, a circle that has a curved side, an oval, etc. The display area DA may be a semicircle, a half ellipse, etc. which has a side that is straight and curved. In other words, the display area DA may have various shapes. In an exemplary embodiment, if the display area DA has a straight side, a portion of a corner of each shape may be a curve.

The pixels PXL may be disposed on the display area DA of the substrate SUB. Each pixel PXL, the smallest unit that displays an image, may be provided in large number. The pixels PXL may irradiate a white light and/or color light. Each pixel PXL may irradiate any one of red, green and blue, but it is not limited thereto. The pixel PXL may irradiate cyan, magenta, yellow, white, etc.

The pixels PXL may be a light emitting display element that includes an organic light emitting layer, but they are not limited thereto. The pixels PXL may take various forms such as liquid crystal display element, electrophoretic display element, electro-wetting display element, etc. In an exemplary embodiment, the pixels PXL may be light emitting display element.

The wiring part may provide a signal to each pixel PXL from the driving circuit board and include scan lines (not shown), data lines (not shown) and power lines (not shown).

A driver (not shown) may be mounted on the driving circuit board. A signal may be transmitted to each pixel PXL through the wiring part. The driver may include a gate driver (not shown) that transmits scan signal to each pixel PXL along the scan line, a data driver (not shown) that transmits data signal to each pixel PXL along the data line, a timing controller (not shown) controlling the gate driver and the data driver, etc. The gate driver and the data driver may be mounted at various locations, for example, but without limitation thereto, within the display panel DP.

The driving circuit board may further include a chip on film COF connected to the display panel DP. Also, the driving circuit board may further include a flexible printed circuit board FPCB connected to the chip on film COF.

The chip on film COF may output various signals input from the flexible printed circuit board FPCB to the display panel DP. For this purpose, one end of the chip on film COF may be attached to the display panel DP and the other end which is the opposite of the one end may be attached to the flexible printed circuit board FPCB.

The flexible printed circuit board FPCB may be disposed on one surface or a back surface of the display panel DP. Generally, the display panel DP displays images on a front surface of the display panel DP, the back surface of the display panel DP is an area that a user may not be able to see. Therefore, in order to maximize space efficiency and hide functions that do not need to be recognized by a user, the flexible printed circuit board FPCB may be disposed on the back surface of the display panel DP. However, this is only one example, and depending on the need, the flexible printed circuit board FPCB may be positioned on a side surface of the display panel DP or even the chip on film COF and the flexible printed circuit board FPCB may be integrated.

The polarizing film POL may cover the display panel DP, may allow the light irradiated from the display panel DP to penetrate, and reflect the light that flows in from outside. The polarizing film POL may include a cutting part corresponding to an area where the chip on film COF is attached to the display panel DP. The chip on film COF attached to the display panel DP may be exposed to outside through the cutting part of the polarizing film POL.

Meanwhile, in an exemplary embodiment, the display device may be flexible at least in part and may be folded where there is flexibility. The display device may include a bending area (not shown) that has flexibility and that is folded in one direction and a flat area (not shown) that is disposed on at least one side of the bending area and that is not folded but is flat or even. Here, the flat area may have flexibility or may not have flexibility.

FIG. 3 is a cross-sectional view along line I~I' in FIG. 2.
FIG. 4 is a cross-sectional view with an enlarged view of EA1 in FIG. 3.

Referring to FIGS. 2 to 4, a display device according to an exemplary embodiment may include a display panel DP, a driving circuit board, a polarizing film POL, a touch sensing part TS, and a window WD. The display device may further include a barrier layer BL disposed on a lower part of the display panel DP.

The display panel DP may include a substrate SUB and a plurality of pixels PXL disposed on the substrate SUB.

The substrate SUB may include a display area DA and a non-display area NDA disposed on at least one side of the display area DA.

The substrate SUB may include a transparent, insulative material and allow light to pass through. The substrate SUB may be a flexible substrate. The flexible substrate may include a film substrate that includes a high-molecular, organic matter and a plastic substrate. For example, but without limitation thereto, the flexible substrate may include one of polyethersulfone, polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Also, the flexible substrate may include fiber glass reinforced plastic (FRP). In an exemplary embodiment, the substrate SUB may be the flexible substrate.

During manufacture process of the display device, it may be preferable that the material that is used in the substrate SUB have resistance to high processing or treatment temperature (or thermal resistance).

Each pixel PXL may include a thin film transistor TFT and a light emitting element OLED connected to the thin film transistor TFT.

The thin film transistor TFT may include a semiconductor layer SCL disposed on the substrate SUB, a gate electrode GE disposed on the semiconductor layer SCL, and source and drain electrodes SE and DE each coupled to the semiconductor layer SCL.

A buffer layer BUL may be disposed between the substrate SUB and the semiconductor layer SCL. The buffer layer BUL may include an inorganic insulating material. For example, but without limitation thereto, the buffer layer BUL may include at least one of silicon oxide, silicon nitride and silicon oxynitride. Also, the buffer layer BUL may have a single-layer structure or multi-layer structure. For example, but without limitation thereto, the buffer layer BUL may have a single-layer structure that includes one of silicon oxide, silicon nitride and silicon oxynitride. The buffer layer BUL may include a first insulating layer having silicon oxide and a second insulating layer disposed on the first insulating layer and having silicon oxide. The buffer layer BUL may include 3 or more insulating layers that are sequentially stacked.

The buffer layer BUL may prevent impurities from expanding from the substrate SUB to the thin film transistor TFT. Also, the buffer layer BUL may flatten or planarize the surface of the substrate SUB.

The semiconductor layer SCL may be disposed on the buffer layer BUL. The semiconductor layer SCL may include one of amorphous silicon, poly crystalline silicon, oxide semiconductor and organic semiconductor. In the semiconductor layer SCL, an area that connects to the source electrode SE and the drain electrode DE may be a source area and a drain area where impurities are doped or injected. There may be a channel area between the source area and the drain area.

Although not illustrated in the drawings, if the semiconductor layer SCL includes oxide semiconductor, there may be a light blocking layer on an upper part or a lower part of the semiconductor layer SCL to block the light flowing into the semiconductor layer SCL.

There may be a gate insulating layer GI disposed on the semiconductor layer SCL. The gate insulating layer GI may cover the semiconductor layer SCL and may insulate the semiconductor layer and the gate electrode GE. The gate insulating layer GI may include at least one of organic insulating material and inorganic insulating material. For example, but without limitation thereto, the gate insulating layer GI may include at least one of silicon oxide and silicon nitride.

The gate electrode GE may be disposed on the gate insulating layer GI. The gate electrode GE may be connected to a scan line (not shown). The gate electrode GE may include low resistance conductive material and may overlap the semiconductor layer SCL.

There may be a first interlayer insulating layer ILD1 on the gate electrode GE. The first interlayer insulating layer ILD1 may include at least one of organic insulating material and inorganic insulating material. For example, but without limitation thereto, the first interlayer insulating layer ILD1 may include at least one of silicon oxide and silicon nitride. The first interlayer insulating layer ILD1 may insulate the source electrode SE and the drain electrode DE, and the gate electrode GE.

Contact holes that pass through the gate insulating layer GI and the first interlayer insulating layer ILD1 may expose the source area and the drain area of the semiconductor layer SCL.

The source electrode SE and the drain electrode DE may be spaced apart from each other on the first interlayer insulating layer ILD1. The source electrode SE and the drain electrode DE may include low resistance conductive material. One end of the source electrode SE may be connected to a data line (not shown). The other end of the source electrode SE may be connected to the source area of the semiconductor layer SCL via one of the contact holes. One end of the drain electrode DE may be connected to the drain area of the semiconductor layer SCL via another one of the contact holes. The other end of the drain electrode DE may be connected to the light emitting element OLED.

Meanwhile, in an exemplary embodiment, it is described that the thin film transistor TFT has a top gate structure, but it is not limited thereto. For example, without limitation thereto, the thin film transistor TFT may have a bottom gate structure.

There may be a protective layer PSL disposed on the thin film transistor TFT and covering the thin film transistor TFT. The protective layer PSL may be disposed on the substrate SUB and may expose one of the source electrode SE and the drain electrode DE, for example, the drain electrode DE, by partially removing the portion above the drain electrode DE.

The protective layer PSL may include at least one layer. For example, but without limitation thereto, the protective layer PSL may include an inorganic protective layer and an organic protective layer disposed on the inorganic protective layer. The inorganic protective layer may include at least one of silicon oxide and silicon nitride. The organic protective layer may include one of acryl, polyimide (PI), polyamide (PA) and benzocyclobutene (BCB). Also, the organic protective layer, being transparent and flexible, may be a planarization layer capable of performing planarization by reducing curvature of the lower part structure.

The light emitting element OLED may include a first electrode AD disposed on the protective layer PSL, a light emitting layer EML disposed on the first electrode AD and a second electrode CD disposed on the light emitting layer EML.

One of the first electrode AD and the second electrode CD may be an anode, and the other one may be a cathode. For example, but without limitation thereto, the first electrode AD may be an anode, and the second electrode CD may be a cathode.

Also, one of the first electrode AD and the second electrode CD may be a transmissive electrode. For example, but without limitation thereto, if the light emitting element OLED is a bottom emission organic light emitting device, the first electrode AD may be a transmissive electrode and the second electrode CD may be a reflective electrode. If the light emitting element OLED is a top emission organic light emitting element, the first electrode AD may be a reflective electrode and the second electrode CD may be a transmissive electrode. In an exemplary embodiment, it is described that the light emitting element OLED is a top emission organic light emitting device and the first electrode AD is an anode.

The first electrode AD may be disposed on the protective layer PSL. The first electrode AD may be a reflective layer (not shown) capable of reflecting light and a transparent conductive layer (not shown) disposed on the upper part or lower part of the reflective layer. At least one of the transparent conductive layer and the reflective layer may be connected to the drain electrode DE.

The reflective layer may include a material capable of reflecting light. For example, but without limitation thereto, the reflective layer may include at least one of aluminum (Al), silver (Ag), chrome (Cr), molybdenum (Mo), platinum (Pt), nickel (Ni) and an alloy thereof.

The transparent conductive layer may include transparent conductive oxide. For example, but without limitation thereto, the transparent conductive layer may include at least one transparent conductive oxide of indium tin oxide (ITO), indium zinc oxide (IZO), aluminum zinc oxide (AZO), gallium doped zinc oxide (GZO), zinc tin oxide (ZTO), gallium tin oxide (GTO) and fluorine doped tin oxide (FTO).

There may be a pixel defining layer PDL disposed on the first electrode AD. The pixel defining layer PDL may be disposed between light emitting areas of each pixel PXL and may expose the first electrode AD. Also, the pixel defining layer PDL may overlap an edge portion of the first electrode AD.

The pixel defining layer PDL may include organic insulating material. For example, but without limitation thereto, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin and silane based resin.

The light emitting layer EML may be disposed on an exposed surface of the first electrode AD. The light emitting layer EML may have a multi-layer thin film structure including at least a light generation layer. For example, but without limitation thereto, the light emitting layer EML may include a hole injection layer for injecting holes, a hole transport layer for increasing a recombination chance between hole and electron by restricting transfer of electron that did not combine in the light generation layer, the light generation layer emitting light due to the recombination of the injected electron and hole, a hole blocking layer for blocking transfer of hole that did not combine in the light generation layer, an electron transport layer for smoothly transporting electron to the light generation layer, and an electron injection layer injecting electron.

The color of the light generated in the light generation layer may be one of red, green, blue and white, but it is not limited thereto. For example, but without limitation thereto, the color of the light generated in the light generation layer of the light emitting layer EML may be one of magenta, cyan and yellow.

The hole injection layer HIL, the hole transport layer HTP, the electron transport layer ETL, and the electron injection layer EIL may be a common layer connected from light emitting areas of adjacent pixels PXL.

The second electrode CD may be disposed on the light emitting layer EML. The second electrode CD may be a reflective layer, but is not limited thereto, and may be a semi transmissive reflective layer. If the second electrode CD is a semi penetrative reflective layer, for example, the second electrode CD may include a thin film metal layer having a thickness that is enough to allow light to pass through. In such case, the second electrode CD may allow a portion of the light that is generated in the light generation layer to pass through and reflect the rest of the light that is generated in the light generation layer.

A capping layer ECL may be disposed on the second electrode CD. The capping layer ECL may prevent oxygen and moisture from penetrating into the light emitting element OLED. The capping layer ECL may include a plurality of inorganic layers (not shown) and a plurality of organic layers (not shown).

In an exemplary embodiment, it is described that the capping layer ECL is applied to isolate the light emitting element OLED from an external environment, but it is not limited thereto. For example, but without limitation thereto, in order to isolate the light emitting element OLED from the external environment, an encapsulation substrate may be applied, instead of the capping layer ECL. In the case that the light emitting element OLED is isolated from the external environment using the encapsulation substrate, the capping layer ECL may be omitted.

The barrier layer BL may be disposed on the lower part of the display panel DP to protect the display panel DP. The barrier layer BL may include a lower part protective film including multi layers having continuously stacked single layers formed of inorganic insulating material and/or organic insulating material. Also, the barrier layer BL may include a cushion layer including elastic material that changes due to the force that is applied from an external part and that is capable of being restored to the original state once the force that has been applied from an external part is removed. The cushion layer may be formed of sponge having elasticity, etc., but is not limited thereto.

The driving circuit board may be connected to the display panel DP. The driving circuit board may include a chip on film COF and a flexible printed circuit board FPCB.

One end of the chip on film COF may be connected to an end of the display panel DP and may connect the pixels PXL in the display panel DP to the flexible printed circuit board FPCB. The chip on film COF may overlap a portion of the display panel DP from a plan view. In detail, from a plan view, one end of the chip on film COF may overlap a non-display area NDA of the display panel DP. The chip on film COF may have elasticity and may bend accordingly.

The chip on film COF may include an insulating film (not shown) and a plurality of wires (not shown) disposed on the insulating film. The chip on film COF may refer to a state where an insulating film formed of a thin film and wires on the insulating film are formed. The chip on film COF may be referred to as a tape carrier package, a flexible printed circuit board, etc. Regarding the chip on film COF, though not shown, a semiconductor chip coupled to at least a portion of the wires may be further mounted on the insulating film.

The flexible printed circuit board FPCB may be connected to the other end of the chip on film COF. The flexible printed circuit board FPCB may be positioned in a back surface of the substrate SUB.

The polarizing film POL may be disposed on the front surface of the display panel DP, that is, on the display area DA, with a first adhesive ADL1 therebetween. Here, the polarizing film POL may be provided, with a portion removed, so as not to overlap the chip on film COF. An area where the chip on film COF overlaps the display panel DP may be exposed to outside but may be protected by being covered by the first adhesive ADL1.

The first adhesive ADL1 may be transparent adhesive, or sticking agent, with high light transmissivity. The first adhesive ADL1 may include at least one of a resin, an optical clear adhesive OCA, and a pressure sensitive adhesive PSA. The first adhesive ADL1 may be attached to the display panel DP and the polarizing film POL.

The polarizing film POL may minimize loss of light irradiated from the light emitting element OLED to outside even while enhancing recognizability of the display device by restricting reflection of external light. The polarizing film POL may include a linear polarizer and a phase retardation layer. The polarizing film POL is described below.

The touch sensing part TS may be disposed on the polarizing film POL with a second adhesive ADL2 therebetween. The second adhesive ADL2 may be formed of same material as the first adhesive ADL1.

The touch sensing part TS may include a sensing part for detecting the location of a touch made by a user. The touch sensing part TS may include a touch area from which touch input is received and a non-touch area from which the touch input is not received. The touch area may overlap the display area DA of the display panel DP. The non-touch area may overlap the non-display area NDA of the display panel DP. The touch area and the display area DA, and the non-touch area and the non-display area NDA may have different areas and/or different shapes.

The sensing part of the touch sensing part TS may be driven by mutual capacitance or self capacitance. The touch sensing part TS is described below.

The window WD may protect the display panel DP by being provided on the polarizing film POL with a third adhesive ADL3 therebetween. The third adhesive ADL3 may be formed of same material as the first and second adhesives ADL1 and ADL2.

The window WD may have a shape corresponding to the display panel DP and may overlap at least a portion of the front surface of the display panel DP. For example, but without limitation thereto, if the display panel DP has a rectangular shape, the window WD may also have the corresponding rectangular shape. If the display panel DP has a circular shape, the window WD may also have the corresponding circular shape.

The window WD may allow images from the display panel DP to pass through and also prevent the display panel DP from being destroyed or from malfunctioning as a result of an external shock by cushioning or softening the external shock. The external shock may be a force applied from an external part that can be expressed as a pressure, stress, etc. and may refer to a force that can cause the display panel DP to be defective. The window WD may be flexible in its entirety or at least a portion of the window WD may be flexible.

FIG. 5 is a plan view of a polarizing film according to an exemplary embodiment. FIG. 6 is a cross-sectional view of a polarizing film in FIG. 5.

Referring to FIGS. 5 and 6, in an exemplary embodiment, a polarizing film POL may include a polarizer PVA, first and second TAC films TAC1 and TAC2, a protective film PSF, and an optical layer OPL.

The polarizer PVA may have a polarizing axis and may linearly polarize the light in a direction that is vertical to the polarizing axis. For example, but without limitation thereto, the polarizer PVA may absorb the light that coincides with the polarizing axis and may allow the light that is vertical to the polarizing axis to pass through. Therefore, if the light passes through the polarizer PVA, the light may be linearly polarized in a direction that is vertical to the polarizing axis.

The polarizer PVA may be formed of a layer of which dichroic dye is oriented by adsorption on uniaxially elongated polyvinyl alcohol-based resin film. The polyvinyl alcohol-based resin film may be denaturalized, and polyvinyl formal, polyvinyl acetal, polyvinyl butyral, etc. which have been denatured as aldehydes may be used, for example, but without limitation thereto. The dichroic dye may be, for example, but without limitation thereto, iodine, organic dye, etc.

The polarizer PVA may be like a polyvinyl alcohol-based film, a polypropylene-based film, etc., a layer formed by coating, or a metal pattern layer such as a wire grid polarizer WGP, etc.

The polyvinyl alcohol-based resin that was unveiled or made as a film may be used as the original film. A method for unveiling the polyvinyl alcohol-based resin is not limited and a proper method that has been made known to the public may be used for this purpose. The thickness of the original film formed of the polyvinyl alcohol-based resin is not limited, but it is may be, for example, but without limitation thereto, approximately 10 μm~150 μm.

The first and second TAC films TAC1 and TAC2 may protect and support the polarizer PVA by being respectively disposed on one surface and back surface of the polarizer PVA. The first and second TAC films TAC1 and TAC2 may be formed of a resin film.

Meanwhile, though not illustrated, the polarizer PVA may have one protective layer only or include at least one protective layer. For example, but without limitation thereto, a triacetylcellulose (TAC) layer may be further included on at least one surface of the upper part surface and the lower part surface of the polarizer PVA. The protective layer may include, not only triacetylcellulose, but also cyclo olefin polymer (COP), polyethylene terephthalate (PET), acryl, etc., however, it is not limited thereto. For example, the protective layer may further include a hard coating layer, a reflection blocking layer, an anti-glare layer, etc.

Depending on a type of the resin forming the first and second TAC films TAC1 and TAC2, permeability, transparency, mechanical strength, thermostability, moisture shielding property, isotropy, etc. may vary. Therefore, the type of the resin forming the first and second TAC films TAC1 and TAC2 may be selected and used to be properly fitting for an electronic device for which the polarizing film POL is applied. A material for forming the first and second TAC films TAC1 and TAC2 is not limited, but all materials that have been publicly known in the field may be used. In an exemplary embodiment, for the first and second TAC films TAC1 and TAC2, a cellulose-based resin such as triacetyl cellulose, etc., a cyclo olefin-based resin such as norbornene-based resin, etc. an olefin-based resin such as polyethylene, polypropylene, etc., polyester-based resin, (met)acryl-based resin, etc. In an exemplary embodiment, the first and second TAC films TAC1 and TAC2 may be a cellulose-based resin.

The protective film PSF may be disposed on the first TAC film TAC1 and may prevent the surface of the polarizer PVA from being damaged. The protective film PSF may include a transparent sticking agent or adhesive. As for the adhesive, for example, but without limitation thereto, a solvent adhesive, an emulsion adhesive, a pressure sensitive adhesive, a solvent free adhesive, an adhesive on a film, a hot-melt adhesive, etc. Also, the adhesive may further include a waterborne adhesive of which a base material of the adhesive is dissolved or distributed in water. The sticking agent may include acryl, silicon, rubber, urethane, poly ester or epoxy copolymer, etc.

The optical layer OPL may be attached to the second TAC film TAC2 with a sticking agent ADL therebetween. Here, for the sticking agent ADL, an acryl-based sticking agent may be used.

In an exemplary embodiment, the optical layer OPL may be a phase retardation layer. Hereinafter, for convenience, the optical layer OPL is referred to as the phase retardation layer.

The phase retardation layer OPL may, by retarding phase, allow the light irradiated from the display panel DP to selectively pass through or reflect the light, or may allow the light supplied from the polarizer PVA to selectively pass through or reflect the light. The phase retardation layer OPL may include a liquid crystal coating film such as cholesteric liquid crystal. Also, the phase retardation layer OPL may include a quarter wave plate (hereinafter λ/4 retardation layer) generating λ/4 phase retardation of the light irradiated from the display panel DP or a half wave plate (hereinafter λ/2 retardation layer) generating λ/2 phase retardation of the light.

The polarizing film POL having a structure as described above may be flexible and may bend accordingly. The polarizing film POL may have a size or a shape corresponding to those of a substrate (refer to SUB in FIG. 2) of the display panel (DP in FIG. 2) from a plan view. For example, but without limitation thereto, the polarizing film POL may have substantially the same shape and size of the substrate SUB, but it is not limited thereto. In an exemplary embodiment, the polarizing film POL may have different shapes and sizes from those of the substrate SUB.

The polarizing film POL may include a first part POL_1 and a second part POL_2.

The first part POL_1 may correspond to a display area (see DA of FIG. 2) of the substrate SUB and may include a pair of short sides that are parallel to each other in a first direction DR1 and a pair of long sides that are parallel to each other in a second direction DR2 crossing the first direction DR1. The first part POL_1 may have a shape of a quadrilateral consisting of straight sides.

The second part POL_2 may correspond to a non-display area (see NDA of FIG. 2) of the substrate SUB and may protrude toward the second direction DR2 from one of the short sides of the first part POL_1. The second part POL_2 may have a shape consisting of a straight side and curved side.

Also, the polarizing film POL may further include an opening POL_3 removed by a cutting line CTL in a process.

The opening POL_3 may correspond to a non-display area NDA of the substrate SUB and may be a cutting part cut along the cutting line CTL and removed from the polarizing film POL. The opening POL_3 may correspond to an area where a chip on film (refer to COF in FIG. 2) overlaps the substrate SUB in the non-display area NDA. The chip on film COF may be exposed to outside of the substrate SUB by the opening POL_3.

As described above, the polarizing film POL may not be disposed at an area where the chip on film COF overlaps the substrate SUB due to the opening POL_3. Therefore, the area where the chip on film COF overlaps the substrate SUB, that is, the entire thickness of the components stacked on the non-display area NDA may be equal to, the area where the chip on film COF is not attached to the substrate SUB, that is, the entire thickness of the components stacked on the display area DA. The components stacked on the non-display area NDA may include the chip on film COF, the first to third adhesives (see ADL1 to ADL3 of FIG. 3), a touch sensing part (see TS of FIG. 3), and a window (see WD of FIG. 3). Also, the components stacked on the display area DA may include a polarizing film POL, first to third adhesives ADL1 to ADL3, a touch sensing part TS, and a window WD.

Instead of the polarizing film POL being disposed on the non-display area NDA, the chip on film COF may be stacked on the non-display area NDA, the entire thickness of the components stacked on the non-display area NDA, and the entire thickness of the components stacked on the display area DA may be equal to each other. As a result, the visual defect that occurs when the entire thickness of the components disposed on the display area DA and the non-display area NDA is not equal may be minimized.

The polarizing film POL may be divided into the first and second parts POL_1 and POL_2 and the opening POL_3 by the cutting line CTL. Here, one short side of the first part POL_1 and one side of the second part POL_2 may be formed by the cutting line CTL.

The cutting line CTL may include a curved part having curvature and a straight part excluding the curved part. The curved part may include a section where one short side of the first part POL_1 and one side of the second part POL_2 meet. In other words, the section where the one short side of the first part POL_1 and the one side of the second part POL_2 meet may have curvature. Therefore, the opening POL_3 may have a chamfering shape as shown in FIG. 5 due to the cutting line CTL having curvature.

The curved part of the cutting line CTL may include an area having the most curvature. Hereinafter, for the purpose of convenience, the area that has the most curvature among the curved part is referred to as a most curvature part A. The most curvature part A may be a section where one short side of the first part POL_1 and one side of the second part POL_2 meet.

Meanwhile, the polarizing film POL may have an absorption axis 100 parallel to a tangent line TGL of the most curvature part A. The absorption axis 100 of the polarizing film POL may have a same direction as the direction the polarizer PVA is elongated. In an exemplary embodiment, the absorption axis 100 of the polarizing film POL may have an angle of approximately 45° between the first and second directions DR1 and DR2, but it is not limited thereto. For example, but without limitation thereto, the absorption axis 100 of the polarizing film POL may be ±30° from the tangent line TGL as the reference. Here, the polarizing film POL may have a transmission axis that is vertical to the absorption axis 100.

Generally, a crack might occur in the polarizing film POL if there is an external impact or environment conditions, for example, stress based on temperature. Especially, in the high temperature environment, if a reliability test is performed with respect to the polarizing film POL, a crack might appear in the polarizing film POL due to the property difference between the components of the polarizing film POL. Particularly, the polarizer PVA of the components of the polarizing film POL may have a contracting property in the high temperature environment, and the components stacked in the polarizer PVA, for example, the first and second TAC films TAC1 and TAC2, the sticking agent ADL, etc. may have an expanding property in the high temperature environment. Such property difference between the components may cause stress between the polarizer PVA and the components that are stacked in the polarizer PVA, ultimately causing a crack to occur in the polarizing film POL.

Also, the polarizer PVA may be uniaxially elongated in a direction of the absorption axis 100, and therefore may be vulnerable to fracture in a direction crossing at right angles with the elongation direction, that is, the direction of the transmission axis. Therefore, if there is a crack due to the polarizer PVA, or if the crack occurs when being handled, the crack may proceed in the direction of the absorption axis 100, not the transmission axis. The crack may cause defect in the polarizing film POL and reduce reliability of the display device having the polarizing film POL.

Particularly, if the polarizing film POL is bent in the high temperature environment, due to the property difference of the components of the polarizing film POL and the impact applied from the outside, stress may be focused on the polarizing film POL. As a result, a crack may occur in the polarizing film POL.

For example, but without limitation thereto, if the polarizing film POL having 0°, 45°, 90° and 135° absorption axis respectively is bent in a high temperature environment, stress may be focused on the polarizing film POL as described above. However, due to the degree of the stress, whether or not crack occurs may differ. Hereinafter, for the purpose of convenience, the polarizing film POL having a 90° absorption axis is referred to as a first polarizing film POL, the polarizing film POL having a 0° absorption axis is referred to as a second polarizing film POL, the polarizing film POL having a 135° absorption axis is referred to as a third polarizing film POL, and the polarizing film POL having a 45° absorption axis is referred to as a fourth polarizing film POL.

If the first polarizing film POL is bent in a high temperature environment in a direction crossing the absorption axis at a right angle (0°), due to the property difference of the components of the first polarizing film POL and the impact applied from the outside, stress may be focused on the first polarizing film POL. Also, if an opening POL_3 is formed by cutting the first polarizing film POL along the cutting line CTL having curvature, a micro crack may occur in the opening POL_3 due to the cutting process. If the opening POL_3 has a chamfering shape as shown in FIG. 5, the micro crack may proceed in a direction that is vertical to the tangent line TGL of the most curvature part A of the cutting line CTL (135°), and thus stress may be even more focused on the first polarizing film POL. In such case, a crack may proceed in a direction of the absorption axis of the first polarizing film POL, and the first polarizing film POL may be defective.

If the second polarizing film POL is bent in a high temperature environment in a direction crossing the absorption axis at a right angle (90°), due to the reasons set forth above, stress may be focused on the second polarizing film POL. Also, if an opening POL_3 is formed by cutting the second polarizing film POL along the cutting line CTL having curvature, a micro crack may occur in the opening POL_3 due to the cutting process. If the opening POL_3 has a chamfering shape, the micro crack may proceed in a direction that is vertical to the tangent line TGL of the most curvature part A of the cutting line CTL (135°), and thus stress may be even more focused on the second polarizing film POL. In such case, a crack may proceed in a direction of the absorption axis of the second polarizing film POL, and the second polarizing film POL may be defective.

If the third polarizing film POL is bent in a high temperature environment in a direction crossing the absorption axis at a right angle (45°), due to the reasons set forth above, stress may be focused on the third polarizing film POL. Also, if an opening POL_3 is formed by cutting the third polarizing film POL along the cutting line CTL having curvature, a micro crack may occur in the opening POL_3 due to the cutting process. If the opening POL_3 has a chamfering shape, the micro crack may proceed in a direction that is vertical to the tangent line TGL of the most curvature part A of the cutting line CTL (135°), and thus stress may be even more focused on the third polarizing film POL. In such case, a crack may proceed in a direction of the absorption axis of the third polarizing film POL, and the third polarizing film POL may be defective.

If the fourth polarizing film POL is bent in a high temperature environment in a direction crossing the absorption axis at a right angle (135°), stress may be focused on the polarizing film POL. Also, if an opening POL_3 is formed by cutting the fourth polarizing film POL along the cutting line CTL having curvature, a micro crack may occur in the opening POL_3 due to the cutting process. If the opening POL_3 has a chamfering shape, the micro crack may proceed in a direction that is vertical to the tangent line TGL of the most curvature part A of the cutting line CTL (135°), in the case of the fourth polarizing film POL, the direction vertical to the tangent line TGL of the most curvature part A may become the transmission axis. As aforementioned the crack does not proceed in the direction of the transmission axis, no micro crack may proceed in the fourth polarizing film POL. Therefore, problems relating to the micro crack may be avoided or prevented.

In an exemplary embodiment, the polarizing film POL may be formed so as to make the absorption axis 100 of the polarizing film POL parallel to the tangent line TGL of the most curvature part A, the micro crack may be prevented from proceeding along the absorption axis 100 of the polarizing film POL. Therefore, reliability of the polarizing film POL may be enhanced.

In an exemplary embodiment, the opening POL_3 of the polarizing film POL may correspond to a part where the chip on film COF is attached to the substrate SUB, but it is not limited thereto. For example, but without limitation thereto, the opening POL_3 of the polarizing film POL may be an area that corresponds to a camera hole (not shown) of the display device to which the polarizing film POL is applied. That is, the polarizing film POL may include the opening POL_3 from where the area corresponding to the camera hole is removed. In this case, the polarizing film POL may be formed to have an absorption axis 100 parallel to the tangent line of the area having the most curvature in the opening POL_3 corresponding to the shape of the camera hole.

FIG. 7 is a block diagram of an exemplary process of manufacturing a polarizing film in FIGS. 5 and 6. FIG. 8 is a perspective view for schematically illustrating a stretching process from an exemplary manufacturing process of a polarizing film in FIG. 7. FIG. 9 is a perspective view of a polarizing film with respect to which a first cutting process has been performed from the exemplary manufacturing process of the polarizing film in FIG. 7. FIG. 10 is a perspective view of a polarizing film with respect to which a second cutting process has been performed from the exemplary manufacturing process of the polarizing film in FIG. 7.

Referring to FIGS. 5 to 10, the polarizing film POL according to an exemplary embodiment may be formed through a pretreatment process S10, a stretching process (S20), a coating and laminating process S30, an inspecting process S40, a first cutting process (S50), a second cutting process S60 and a post-treatment process S70.

The pretreatment process S10 may include a process for preparing, cleansing and drying the base material of the polarizer PVA, the first and second TAC films TAC1 and TAC2, the protective film PSF, etc.

After the pretreatment process S10 is performed, the first TAC film TAC1 may be stacked on one surface of the polarizer PVA, the second TAC film TAC2 may be stacked on the other surface of the polarizer PVA, and the stretching process S20 for stretching the polarizer PVA may be performed. For the purpose of convenience, the polarizer PVA, and the first and second TAC films TAC1 and TAC2 that are respectively stacked on one surface and the other surface of the polarizer PVA are referred to as a polarizing film material layer POL'.

An arbitrary, proper stretching process may be applied to the stretching process S20. In particular, a fixed-end stretching process using a tenter stretching machine, a free-end stretching process (for example, the process for passing the thermoplastic resin material through rolls that have different peripheral speed to uniaxially stretch it), a biaxial stretching process that uses simultaneous biaxial stretching machine, a successive stretching process, etc. may apply to the stretching process. In an exemplary embodiment, the free-end stretching process may be used, which passes the polarizing film material layer POL' through the rolls 32, 32, 33, 33 having different peripheral speeds as shown in FIG. 8, stretching it in a conveying direction MD. Here, the polarizing film material layer POL' may have an absorption axis that is consistent with the conveying direction MD.

Sequentially, a coating and laminating process S30 may be performed which laminates the protective film PSF on the surface of the first TAC film TAC1, coating the adhesive layer ADL on the surface of the second TAC film TAC2, and stacking the phase retardation layer OPL. For the coating and laminating process S30, the coating process and the laminating process may be separately carried out.

Thereafter, the inspecting process S40 that automatically inspects the polarizing film which is finished up to the coating and laminating process S30 with an automatic inspector.

The first cutting process S50 may be a process for cutting the polarizing film which is finished up to the inspecting process S40 in cell units, and the first cutting process S50 may be performed using laser, etc. The polarizing film POL" that is cut by the cell by the first cutting process may be cut in the conveying direction MD and a diagonal direction. As a result, the polarizing film POL" that is cut by the cell may have approximately a 45° absorption axis 100. Here, the polarizing film POL" that is cut by the cell may be cut to have an absorption axis 100 that minimizes the progress of micro crack which may occur by the second cutting process S60 which is described below.

The second cutting process S60 may be a process for forming the polarizing film that is cut by the cell with the polarizing film POL from which a portion is removed along the cutting line CTL. The second cutting process S60 may be performed using laser, endmill, etc. The polarizing film POL with which the second cutting process S60 is finished may include, due to the cutting line CTL, first and second parts POL_1 and POL_2 and an opening POL_3.

The cutting line CTL may include a curved part having curvature and a straight part excluding the curved part. The curved part may include an area A having the most curvature. The absorption axis 100 of the polarizing film POL may be parallel to the tangent line TGL of the area A having the most curvature. Since the polarizing film POL is manufactured such that the absorption axis 100 of the polarizing film POL is parallel to the tangent line TGL of the area A having the most curvature, the micro crack which occurs in the opening POL_3 during the second cutting process (S60) may not proceed along the absorption axis of the polarizing film POL.

The post-treatment process S70 may include a process for removing impurities from the polarizing film with which the second cutting process S60 is finished, a chamfering process processing or milling the edge of the cut polarizing film POL, a packaging process, etc.

In an exemplary embodiment, it is described that the inspecting process S40 is described as being performed between the coating and laminating process S30 and the first cutting process S50, but it is not limited thereto. For example, but without limitation thereto, the inspecting process S40 may be performed in the post-treatment process S70. Also, in an exemplary embodiment, the manufacture process of the polarizing film POL may be changed based on process conditions, etc., it is not limited to the aforementioned exemplary embodiment.

FIGS. 11A and 11B are plan views of a polarizing film according to another exemplary embodiment. In FIGS. 11A and 11B, in order to avoid repetitive description, the polarizing film is described mainly on the difference from the aforementioned exemplary embodiment. Any portion that is not described shall follow the aforementioned exemplary embodiment. The same reference numeral refers to the same component, and a similar reference numeral refers to similar components.

Referring to FIG. 11A, the polarizing film POL according to another exemplary embodiment may include first and second parts POL_1 and POL2 divided by the cutting line CTL, an opening POL_3 and a fourth part POL_4.

The first part POL_1 may include a pair of short sides that are parallel to each other in a first direction DR1 and a pair of long sides that are parallel to each other in a second direction DR2. The second direction DR2 may cross the first direction DR1. The first part POL_1 may have a quadrilateral shape formed of straight sides.

The second part POL_2 may have a smaller area than the first part POL_1. The second part POL_2 may protrude from one short side of the first part POL_1 toward the second direction DR2. The second part POL_2 may have a shape formed of a straight side and curved side. The fourth part POL_4 may have a smaller area than the first part POL_1. The fourth part POL_4 may be spaced apart with consistence from the second part POL_2 with the opening POL_3 therebetween. The fourth part POL_4 may protrude toward the second direction DR2 from one short side of the first part POL_1. The fourth part POL_4 may have a shape that is different from the second part POL_2. Also, the fourth part POL_4 may have a quadrilateral shape consisting of straight sides.

Here, one short side of the first part POL_1, one side of the second part POL_2, and one side of the fourth part POL_4 may be formed by the cutting line CTL.

The opening POL_3 may be an area that is cut along the cutting line CTL from the polarizing film POL and may be positioned between the second part POL_2 and the fourth part POL_4.

Also, the opening POL_3 may have a shape corresponding to the shape of the cutting line CTL. In an exemplary embodiment, the cutting line CTL may include a curved part having curvature or a straight part excluding the curved part. The curved part may have curvature at a section where one short side of the first part POL_1 and one side of the second part POL_2 meet. Therefore, a portion of the opening POL_3 may have a chamfering shape as shown in the drawings by the cutting line CTL. In an exemplary embodiment, the opening POL_3 may have a shape in which "⊏" shape is turned 90° to the right.

The curved part of the cutting line CTL may include an area A having the most curvature. The area A having the most curvature may be provided on the one side of the second part POL_2.

The polarizing film POL may have an absorption axis 100 parallel to the tangent line TGL of the area A having the most curvature. As a result, when the cutting process that forms the opening POL_3 is performed in the polarizing film POL, a micro crack occurring in the cutting line CTL may be prevented from progressing along the absorption axis 100 of the polarizing film POL.

Referring to FIG. 11B, the polarizing film POL according to another exemplary embodiment may include first and second parts POL_1 and POL_2 divided by the cutting line CTL, an opening POL_3 and a fourth part POL_4.

The first part POL_1 may include a pair of short sides that are parallel to each other in a first direction DR1, and a pair of long sides that are parallel to each other in a second direction DR2. The second direction DR2 may cross the first direction DR1. The first part POL_1 may have a quadrilateral shape formed of straight sides.

The second part POL_2 may have a smaller area than the first part POL_1. The second part POL_2 may protrude from one short side of the first part POL_1 toward the second direction DR2. The second part POL_2 may have a shape consisting of a straight side and curved side.

The fourth part POL_4 may be spaced apart from the second part POL_2 with consistence with the opening POL_3 therebetween. The fourth part POL_4 may protrude from one short side of the first part POL_1 toward the second direction DR2. The fourth part POL_4 may have the same shape as the second part POL_2. Also, the fourth part POL_4 may have a shape consisting a of straight side and a curved side.

Here, one short side of the first part POL_1, one side of the second part POL_2 and one side of the fourth part POL_4 may be formed by the cutting line CTL.

The opening POL_3 may be an area cut along the cutting line CTL from the polarizing film POL and may be positioned between the second part POL_2 and the fourth part POL_4.

Also, the opening POL_3 may have a shape corresponding to the shape of the cutting line CTL. In an exemplary embodiment, the cutting line CTL may include a curved part having curvature. The curved part may have curvature at a section where one short side of the first part POL_1 and one side of the second part POL_2 meet. Also, the curved part may have curvature at a section where one short side of the first part POL_1 and one side of the fourth part POL_4 meet. Therefore, the opening POL_3 may have a semi-circle shape as shown in the drawings due to the cutting line CTL.

The curved part of the cutting line CTL may include a first area A and a second area B having most curvatures. The first area A having the most curvature may be provided on the one side of the second part POL_2, and the second area B having the most curvature may be provided on the one side of the fourth part POL_4.

The polarizing film POL may have an absorption axis parallel to the tangent line TGL of any one area of the first and second areas A and B having the most curvature. For example, but without limitation thereto, in an exemplary embodiment, the polarizing film POL may have an absorption axis 100 parallel to the tangent line TGL of the first area A having the most curvature.

As a result, when the cutting process is performed which forms the opening POL_3 from the polarizing film POL, the micro crack which occurs in the cutting line CTL may be prevented from progressing along the absorption axis 100 of the polarizing film POL.

FIG. 12 is an equivalent circuit diagram illustrating one pixel out of the pixels shown in FIG. 2.

Referring to FIGS. 2 and 12, each pixel PXL may include a thin film transistor connected to lines, a light emitting element EL connected to the thin film transistor and a storage capacitor Cst.

The thin film transistor may include a driving thin film transistor TR2 for controlling the light emitting element EL and a switching thin film transistor TR1 switching the driving thin film transistor TR2. In an exemplary embodiment, one pixel PXL is described as including two thin film transistors TR1 and TR2, but it is not limited thereto. One pixel PXL may include one thin film transistor and one capacitor, or one pixel PXL may include three or more thin film transistors and two or more capacitors. For example, but without limitation thereto, one pixel PXL may include seven thin film transistors, one light emitting element, and one storage capacitor.

The switching thin film transistor TR1 may include a gate electrode, a source electrode and a drain electrode. As to the switching thin film transistor TR1, the gate electrode may be connected to the gate line GL, and the source electrode may be connected to the data line DL. The drain electrode may be connected to the gate electrode of the driving thin film transistor TR2. The switching thin film transistor TR1 may transmit a data signal applied to the data line DL to the driving thin film transistor TR2 according to a scan signal applied to the gate line GL.

The driving thin film transistor TR2 may include a gate electrode, a source electrode and a drain electrode. As to the driving thin film transistor TR2, the gate electrode may be connected to the switching thin film transistor TR1, the source electrode may be connected to the driving voltage line DVL, and the drain electrode may be connected to the light emitting element EL.

The light emitting element EL may include a light emitting layer and a first electrode and a second electrode facing each other with the light emitting layer therebetween. The first electrode may be connected to the drain electrode of the driving thin film transistor TR2. The second electrode may be connected to the power line (not shown) and a common voltage may be applied. As the light emitting layer emits light according to an output signal of the driving thin film transistor TR2, images may be displayed on the display device by irradiating light or not irradiating light. Here, the light irradiated from the light emitting layer may vary based on the material of the light emitting layer, and it may be color light or white light.

The storage capacitor Cst may be coupled between the gate electrode and the source electrode of the driving thin film transistor TR2 and may charge and maintain the data signal input to the gate electrode of the driving thin film transistor TR2.

FIG. 13 is a plan view of a touch sensing part in FIG. 3 where the touching sensing part is self capacitive. FIG. 14 is a cross-sectional view along the line II~II' in FIG. 13.

Referring to FIGS. 3, 13 and 14, the touch sensing part TS according to an exemplary embodiment may include a plurality of sensing parts SEL, wires TRL, and pads coupled to one end of the wires TRL.

In an exemplary embodiment, the sensing parts SEL are shown as having quadrilateral shape, but they are not limited thereto and may have various shapes. For example, but without limitation thereto, the sensing parts SEL may have circle shapes. Or the sensing parts SEL may have a stripe shape overall as each extends in one direction. If the sensing parts SEL extend in one direction, the direction that they are extended may change such as the second direction DR2 of the substrate SUB of the display panel (see DP of FIG. 2), slanted direction, etc.

The sensing parts SEL may include conductive material. For example, but without limitation thereto, metal, alloy thereof, conductive polymer, conductive metal oxide, etc. may be used as the conductive material. In an exemplary embodiment, metal may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, etc. The conductive metal oxide may be indium tin oxide (ITO), indium zinc oxide (IZO), antimony zinc oxide (AZO), indium tin zinc oxide (ITZO), zinc oxide ZnO, tin oxide ($SnO_2$), etc. In an exemplary embodiment, the sensing parts SEL may be a single layer or multi layers. The conductive polymer may be polythiophenes, polypyrroles, polyaniline, polyacetylene, polyphenylenethers compound, and a mixture thereof. Particularly, PEDOT/PSS compound, among polythiophenes, may be used. The conductive polymer is not only easy to manufacture, but also has higher flexibility than the conductive metal oxide, for example, ITO. As a result, there is a low possibility of crack when being bended.

The sensing parts SEL and the wires TRL may be implemented on a separate substrate or on various components included in the display panel DP. In an exemplary embodiment, the sensing parts SEL and the wires TRL may be formed on a separate substrate, for example, a base substrate BS.

The base substrate BS may be formed of insulating material such as glass, resin, etc. Also, the base substrate BS may be formed of materials having flexibility that makes it possible to bend or be folded, and may have a single layer structure or a multi-layer structure. For example, but without limitation thereto, the base substrate BS may include at least one of polysteryrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material forming the base substrate BS may variously change and may be formed of fiber glass reinforced plastic (FRP), etc. In an exemplary embodiment, the base substrate BS may be formed of a material having flexibility.

An insulating layer INS may be disposed on the sensing parts SEL and the wires TRL. The insulating layer INS may electrically insulate the sensing parts SEL and the wires TRL.

The wires TRL may be connected to each of the sensing parts SEL and the pads TRP. Also, the wires TRL may be electrically connected to a driver (not shown) through the pads TRP. For example, but without limitation thereto, the pads TRP may be connected to the driver through separate wire, flexible printed circuit board, tape carrier package, connector, chip on film, etc.

When a user's touch is input to the touch sensing part TS, self-capacitance of the sensing parts SEL related to the touch changes. Therefore, the driver may detect the touch position using a signal output from the sensing parts SEL.

FIG. 15 is a plan view of a touching sensing part in FIG. 3 where the touching sensing part is mutual capacitive. FIG. 16 is a plan view with an enlarged view of EA2 in FIG. 15. FIG. 17 is a cross-sectional view along the line III~III' in FIG. 16.

Referring to FIGS. 3 and 15 to 17, the touch sensing part TS according to an exemplary embodiment may include a base substrate BS, a sensing part SEL, wires TRL and pads TRP connected to one end of the wires TRL.

The sensing part SEL may include a plurality of first sensing parts SEL1 extending in a second direction DR2 of the base substrate BS and to which a sensing voltage is applied and a plurality of second sensing parts SEL2 extending in a first direction DR1 crossing the second direction DR2. The first sensing parts SEL1 may capacitance couple to the second sensing part SEL2 and a voltage may change due to the capacitance coupling.

Each of the first sensing parts SEL1 may include a plurality of first sensing electrodes TE1 arranged in the second direction DR2 and a plurality of first bridges BR1 coupling adjacent first sensing electrodes TEL The first sensing electrodes TE1 may have various shapes, for example, a polygonal shape including a quadrilateral shape such as a bar, a rhombus, etc. In an exemplary embodiment, the first sensing electrodes TE1 and the first bridges BR1 may have a plate shape or a mesh shape consisting of fine lines.

Each of the second sensing parts SEL2 may include a plurality of second sensing electrodes TE2 arranged in the first direction DR1 and a plurality of second bridges BR2 coupling adjacent second sensing electrodes TE2. The second sensing electrodes TE2 may have various shapes, for example, a polygonal shape including a quadrilateral shape such as a bar, a rhombus, etc. The second sensing electrodes TE2 and the second bridges BR2 also may have a plate shape or a mesh shape consisting of fine lines. Here, each of the second bridges BR2 may electrically connect adjacent second sensing electrodes TE2 through the contact hole CH.

The first sensing electrodes TE1 and the second sensing electrodes TE2 may alternate with each other and may be arranged in a matrix shape on the base substrate BS.

The first sensing electrodes TE1 and the second sensing electrodes TE2 may be insulated. Particularly, in FIG. 15, the first bridges BR1 and the second bridges BR2 are shown to cross each other, but the first bridges BR1 and the second bridges BR2 may be insulated with a second interlayer insulating layer ILD2 therebetween. The first sensing electrodes TE1 and the second sensing electrodes TE2 may be provided on different layers, but they are not limited thereto. In an exemplary embodiment, the first sensing electrodes TE1 and the second sensing electrodes TE2 may be provided on a same layer.

Due to the above-described arrangement of the first sensing electrodes TE1 and the second sensing electrodes TE2, mutual capacitance may be formed between the first sensing electrodes TE1 and the second sensing electrodes TE2, and if a touch is input in the touch sensing part TS, mutual capacitance related to the touch may change. In order to prevent the first sensing electrodes TE1 from contacting the second sensing electrodes TE2, there may be a second interlayer insulating layer ILD2 provided between the first sensing electrodes TE1 and the second sensing electrodes TE2. The second interlayer insulating layer ILD2 may be provided on a front surface between the first sensing electrodes TE1 and the second sensing electrodes TE2 or may be provided locally at a crossing section between the first sensing electrodes TE1 and the second sensing electrodes TE2.

It may be preferable for the first sensing electrodes TE1 and the second sensing electrodes TE2 to be formed of transparent, conductive material, but they may be formed of other conductive materials such as opaque metal, etc. For example, but without limitation thereto, the first sensing electrodes TE1 and the second sensing electrodes TE2 may be formed of same material as the above-described sensing parts (see SEL of FIG. 13).

The wires TRL may be connected to each of the sensing part SEL and the pads TRP. Also, the wires TRL may be connected to a driver (not shown) through the pads TRP. For example, but without limitation thereto, the pads TRP may be connected to the driver through separate wire, flexible printed circuit board, tape carrier package, connector, chip on film, etc.

The first sensing electrodes TE1 may receive a driving signal from the driver, and the second sensing electrodes TE2 may output a detection signal reflecting change in the capacitance to the driver. Accordingly, the driver may detect touch position using the detection signal output from the second sensing electrodes TE2.

Hereinafter, referring to FIG. 17, the sensing parts SEL are described in the order they are stacked.

Referring to FIG. 17, the first sensing electrodes TE1, the first bridges BR1 and the second sensing electrodes TE2 may be disposed on the base substrate BS.

The base substrate BS may be formed of insulating material having flexibility.

The first sensing electrodes TE1, the first bridges BR1 and the second sensing electrodes TE2 may include same material and may be disposed on same surface of the base substrate B S.

The second interlayer insulating layer ILD2 including the contact hole CH may be provided on the first sensing electrodes TE1, the first bridges BR1 and the second sensing electrodes TE2. As described above, the second interlayer insulating layer ILD2 may be provided entirely on the base substrate BS having the first sensing electrodes TE1 and the second sensing electrodes TE2 or may be provided locally at a crossing section of the first sensing electrodes TE1 and the second sensing electrodes TE2.

The second bridges BR2 may be disposed on the second interlayer insulating layer ILD2. The second bridges BR2 may be connected to the second sensing electrodes TE2 through the contact hole CH. As a result, the second sensing electrodes TE2 may be electrically connected to the adjacent second sensing electrodes TE2.

An insulating layer INS may be disposed on the second bridges BR2. The insulating layer INS may insulate the second bridges BR2 from outside while covering the second bridges BR2.

The display device according to an exemplary embodiment may be employed in various electronic devices. For example, but without limitation thereto, the display device may be applied in television, notebook, mobile phone, smart phone, smart pad PD, PMP, PDA, navigation, various wearable devices such as smart watch, etc.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An optical film, comprising:
   a phase retardation layer;
   a polarizer disposed on the phase retardation layer and further comprising a first part having a rectangular shape defined by a first pair of sides extending in a first direction and a second pair of sides extending in a second direction perpendicular to the first direction and a second part protruding in the second direction from the first part, the second part having a curved edge extending in both the first direction and the second direction, and a third part protruding in the second direction from the first part, wherein the curved edge of the second part has a curvature that varies along a length of the curved edge and includes an area on the curved edge having a maximum curvature; and
   a protective film disposed on the polarizer,
   wherein the polarizer further comprises an absorption axis in a direction ±30° to a tangent line of the area on the curved edge having the maximum curvature,
   wherein the third part is spaced apart from the second part along the first direction by an opening, and
   wherein the-polarizer is flexible.

2. The optical film of claim 1, wherein the absorption axis of the polarizer is parallel to the tangent line.

3. The optical film of claim 1, wherein the polarizer further comprises a polyvinyl alcohol based resin.

4. The optical film of claim 1, wherein the phase retardation layer further comprises one of µ/4 retardation film, µ/2 retardation film or a liquid crystal coating film.

5. An optical film, comprising:
   a phase retardation layer;
   a polarizer disposed on the phase retardation layer and further comprising a first part defined by a first pair of sides extending in a first direction and a second pair of sides extending in a second direction perpendicular to the first direction, a second part protruding in the second direction from the first part, the second part having a curved edge extending in both the first direction and the second direction, and a third part protruding in the second direction from the first part, wherein the curved edge of the second part has a curvature that varies along a length of the curved edge and includes an area on the curved edge having a maximum curvature; and
   a protective film disposed on the polarizer, wherein the polarizer further comprises an absorption axis in a direction ±30° to a tangent line of the area on the curved edge having the maximum curvature, wherein the third part is spaced apart from the second part along the first direction by an opening, wherein the third part has a same shape as the second part, and wherein the polarizer is flexible.

* * * * *